(12) United States Patent
Liao et al.

(10) Patent No.: US 6,877,990 B2
(45) Date of Patent: Apr. 12, 2005

(54) LAND GRID ARRAY CONNECTOR ASSEMBLY WITH PICK UP CAP

(75) Inventors: Fang-Jwu Liao, Tu-chen (TW); Ming-Lun Szu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/613,468

(22) Filed: Jul. 3, 2003

(65) Prior Publication Data

US 2004/0248431 A1 Dec. 9, 2004

(30) Foreign Application Priority Data

Jun. 6, 2003 (TW) ............................................ 92210421

(51) Int. Cl.⁷ ............................................. H01R 13/60
(52) U.S. Cl. ........................................ 439/41; 439/940
(58) Field of Search .......................... 439/41, 940, 342, 439/135

(56) References Cited

U.S. PATENT DOCUMENTS

| | | | |
|---|---|---|---|
| 5,815,000 A | * 9/1998 | Farnworth et al. | .......... 324/755 |
| 5,819,404 A | 10/1998 | Whiting | |
| 6,155,848 A | * 12/2000 | Lin | ............. 439/135 |
| 6,413,111 B1 | 7/2002 | Pickles et al. | |
| 6,439,913 B1 | * 8/2002 | Ma | ............. 439/342 |
| 6,478,558 B2 | 11/2002 | Yamanaka et al. | |
| 6,478,588 B1 | * 11/2002 | Howell et al. | ............. 439/135 |
| 6,533,592 B1 | 3/2003 | Chen et al. | |
| 6,547,609 B2 | 4/2003 | Howell et al. | |
| 6,561,825 B1 | * 5/2003 | McHugh et al. | ........... 439/135 |
| 6,572,383 B1 | 6/2003 | Yu | |
| 6,626,691 B2 | * 9/2003 | Yu | ............. 439/342 |
| 6,685,494 B1 | * 2/2004 | McHugh et al. | ........... 439/342 |

* cited by examiner

*Primary Examiner*—Hae Moon Hyeon
(74) *Attorney, Agent, or Firm*—Wei Te Chung

(57) ABSTRACT

An LGA connector assembly (1) includes an LGA connector (2) and a generally rectangular pick up cap (3). The connector includes an insulative housing (21), a plurality of contacts (22) received in the housing, and a metal clip (25). The housing defines a cavity (210) for receiving an LGA central processing unit (CPU) therein. The clip is disposed on the housing to press the CPU upon the contacts. The pick up cap is generally rectangular, and has a plurality of clasps (307, 308) at two opposite ends thereof. The clasps snappingly clasp edges of the clip of the connector, thereby securely mounting the pick up cap onto the connector. The pick up cap has a flat top surface (300) to be engaged by a vacuum suction device. The LGA connector assembly thus can be moved to a desire location on a printed circuit board (PCB).

13 Claims, 4 Drawing Sheets

LAND GRID ARRAY CONNECTOR ASSEMBLY WITH PICK UP CAP

BACKGROUND OF THE INVENTION

1. Field of the Invention

The present invention relates to a land grid array (LGA) connector assembly which comprises an LGA connector and a pick up cap, the pick up cap being mounted to the connector for providing a flat top surface to be engaged by a vacuum suction device, whereby the LGA connector assembly can be moved onto a circuit substrate such as a printed circuit board (PCB) on which the connector is to be mounted.

2. Description of the Prior Art

On many production lines, electronic components such as land grid array (LGA) connectors are accurately positioned on circuit substrates such as printed circuit boards (PCBs) by means of vacuum suction devices. Such an LGA connector typically comprises an insulative housing, a plurality of electrical contacts received in the housing, a metal clip pivotably mounted to an end of the housing, and a lever pivotably mounted to an opposite end of the housing for engaging with the clip. The clip has a generally rectangular window in a middle thereof. The contacts each have first contact portions protruding outwardly from a top portion of the housing, for electrically connecting with a multiplicity of metal contact pads of an electronic package such as an LGA central processing unit (CPU). Because of this configuration of the LGA connector, a pick up cap has to be pre-attached on the top portion of the housing. The pick up cap typically has a plurality of latches snappingly engaging with corresponding sidewalls of the housing, thereby mounting the pick up cap onto the LGA connector. The pick up cap has a flat top surface exposing through the window. The vacuum suction device is then able to engage on the flat top surface of the pick up cap, in order to reliably move and accurately position the LGA connector onto the PCB.

However, during attachment of the pick up cap onto the LGA connector or detachment of the pick up cap from the LGA connector, the latches of the pick up cap are liable to hit the first contact portions of some of the contacts and displace those contacts. The displaced contacts cannot reliably contact the corresponding metal contact pads of the CPU, and electrical connection between the CPU with the PCB is liable to be disrupted.

Therefore, a new pick up cap that overcomes the above-mentioned disadvantages is desired.

SUMMARY OF THE INVENTION

Accordingly, an object of the present invention is to provide a land grid array (LGA) connector assembly which has an LGA connector and a pick up cap mounted on the connector, wherein the pick up cap is configured to avoid damaging the connector during attachment of the pick up cap onto the connector and during detachment of the pick up cap from the connector.

To achieve the above-mentioned object, a land grid array (LGA) connector assembly in accordance with a preferred embodiment comprises an LGA connector and a pick up cap. The connector comprises an insulative housing, a plurality of electrical contacts received in the housing, and a metal clip. The housing defines a generally rectangular cavity for receiving an electronic package such as an LGA central processing unit (CPU) therein. A multiplicity of passageways is defined in a portion of the housing under the cavity, the passageways receiving a corresponding number of the contacts therein. The clip is disposed on the housing to press the CPU upon the contacts. The pick up cap is generally rectangular, and has a plurality of clasps at two opposite ends thereof. The clasps snappingly clasp edges of the clip of the connector, thereby securely mounting the pick up cap onto the connector. The pick up cap has a flat top surface be engaged by a vacuum suction device. The LGA connector assembly can thereby be moved onto a circuit substrate, such as a printed circuit board (PCB) (not shown), on which the connector is to be mounted.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
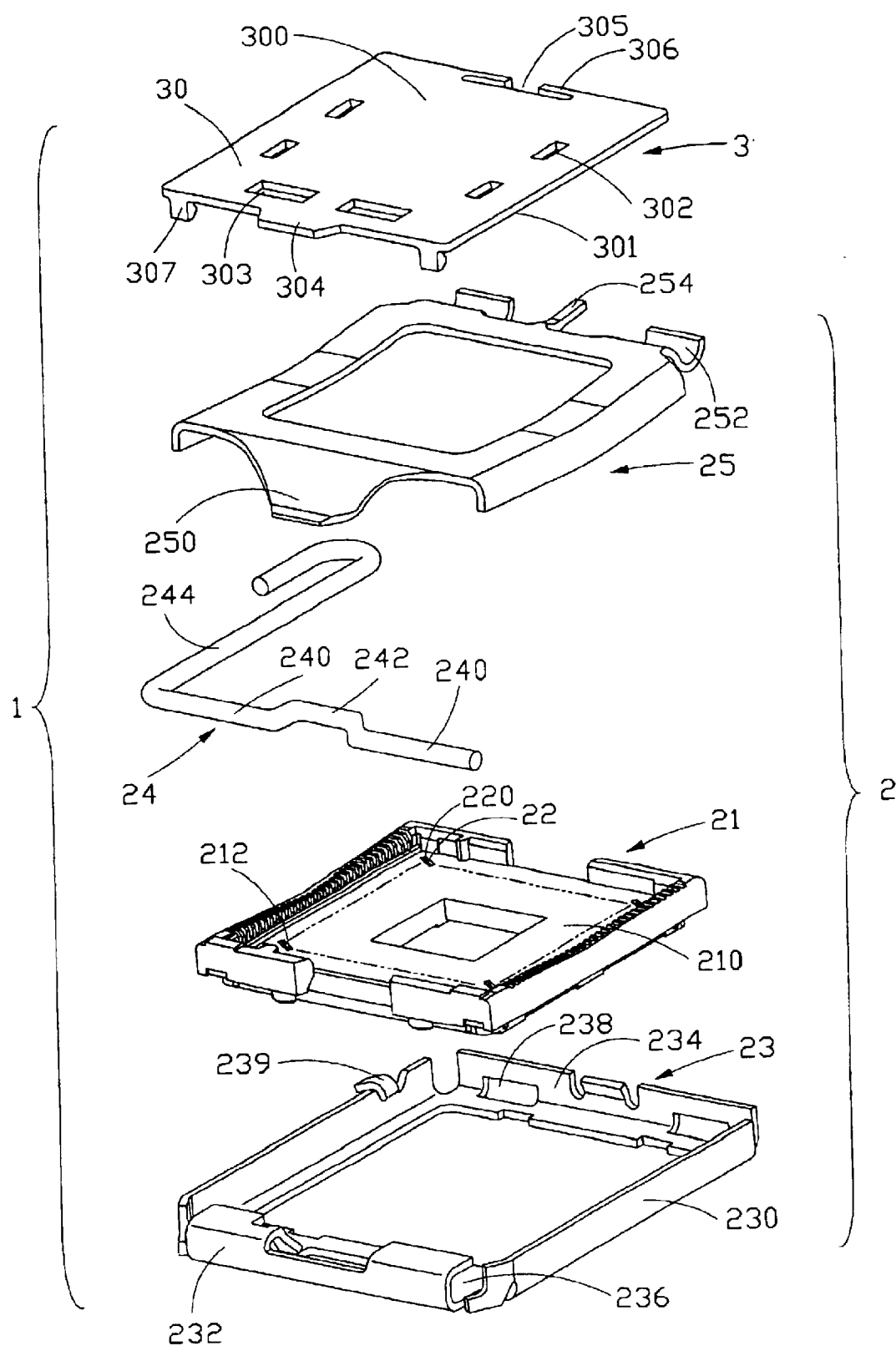
FIG. 1 is an exploded, isometric view of an LGA connector assembly of the present invention, the LGA connector assembly comprising an LGA connector and a pick up cap mounted onto the connector.

FIG. 1 is an exploded, isometric view of a land grid array (LGA) connector assembly 1 in accordance with the preferred embodiment of the present invention. The LGA connector assembly 1 comprises an LGA connector 2 and a generally rectangular pick up cap 3. The pick up cap 3 is mounted onto the connector 2, for providing a flat top surface to be engaged by a vacuum suction device. The LGA connector assembly 1 can thereby be moved onto a circuit substrate, such as a printed circuit board (PCB) (not shown), on which the connector 2 is to be mounted.

The connector 2 comprises a generally rectangular insulative housing 21, a plurality of electrical contacts 22 received in the housing 21, a metal stiffener/frame 23 partly covering and reinforcing the housing 21, a lever 24 pivotably received in an end of the stiffener 23, and a metal clip 25 pivotably mounted to an opposite end of the stiffener 23 for engaging with the lever 24.

Figure 4:
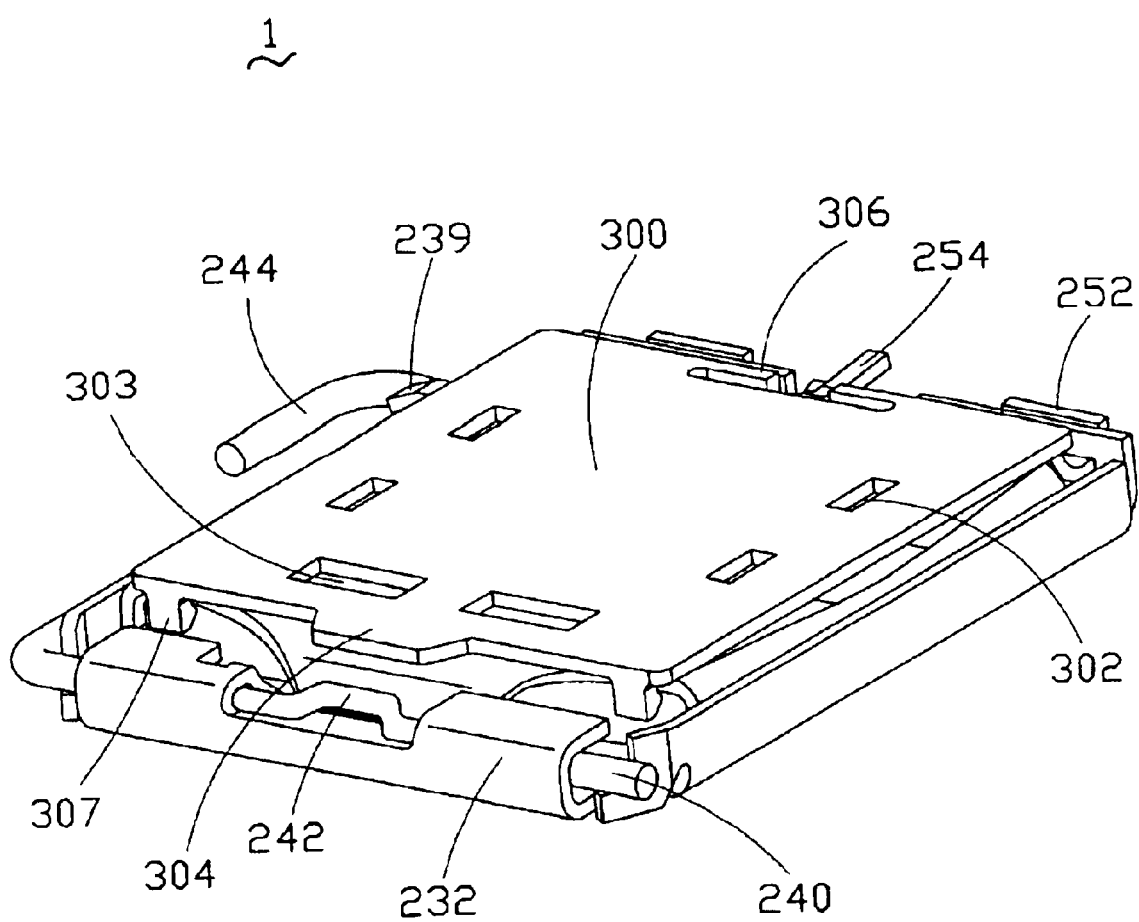
FIG. 4 is an assembled view of FIG. 1.

FIG. 4 is an assembled view of the connector 2 and the pick up cap 3. Referring to FIGS. 1 and 4, the housing 21 defines a generally rectangular cavity 210 in a middle thereof. The cavity 210 is used for receiving an electronic package such as an LGA central processing unit (CPU) (not shown) therein. A multiplicity of passageways 212 is defined in a portion of the housing 21 under the cavity 210, the passageways 212 receiving a corresponding number of the contacts 22 therein respectively. Each contact 22 has a first contact portion 220 protruding outwardly from a top face of the housing 21, for resiliently electrically contacting a corresponding metal contact pad of the CPU. The stiffener 23 comprises a pair of lateral sides 230 each having an L-shaped cross-section, a front end 232 having a U-shaped cross-section, and a rear end 234 having an L-shaped cross-section. The housing 21 is fittingly received in the stiffener 23. An elongate chamber 236 is defined in the front end 232 of the stiffener 23. A pair of spaced slots 238 is defined in the rear end 234 of the stiffener 23. An ear 239 extends arcuately from an edge of one of the lateral sides 230 of the stiffener 23. The lever 24 comprises a pair of locating portions 240 pivotably received in the chamber 236 of the stiffener 23, an offset actuating portion 242 between the locating portions 240, and an operating portion 244 extending perpendicularly from an end of one of the locating portions 240. The operating portion 244 is disposed outside of the stiffener 23. When oriented at a horizontal position parallel to the top face of the housing 21, the operating portion 244 engages with the ear 239. The clip 25 comprises an engaging portion 250 extending arcuately from an end thereof, a pair of spaced securing portions 252 extending arcuately from an opposite end thereof and pivotably received in the slots 238 of the stiffener 23, and a tail 254 between the securing portions 252. When the clip 25 is oriented at a horizontal position parallel to the top face of the housing 21, the engaging portion 250 of the clip 25 engages with the actuating portion 242 of the lever 24, thereby pressing the CPU on the contacts 22. When the clip 25 is oriented at a position perpendicular to the top face of the housing 21, the tail 254 abuts against the stiffener 23 to prevent the clip 25 from being over-rotated.

The pick up cap 3 has a generally rectangular planar body 30. The planar body 30 comprises a flat top surface 300, and a bottom surface 301 opposite to the top surface 300. Two generally rectangular first holes 302 are defined in each of opposite lateral sides of the planar body 30. Two generally rectangular second holes 303 are defined in a front end of the planar body 30. Each of the second holes 303 is larger than each of the first holes 302. A trapeziform lip 304 is formed at a middle of the front end of the planar body 30. A generally T-shaped channel 305 is defined in a middle of an opposite rear end of the planar body 30, thereby forming a pair of opposing arms 306.

Figure 2:
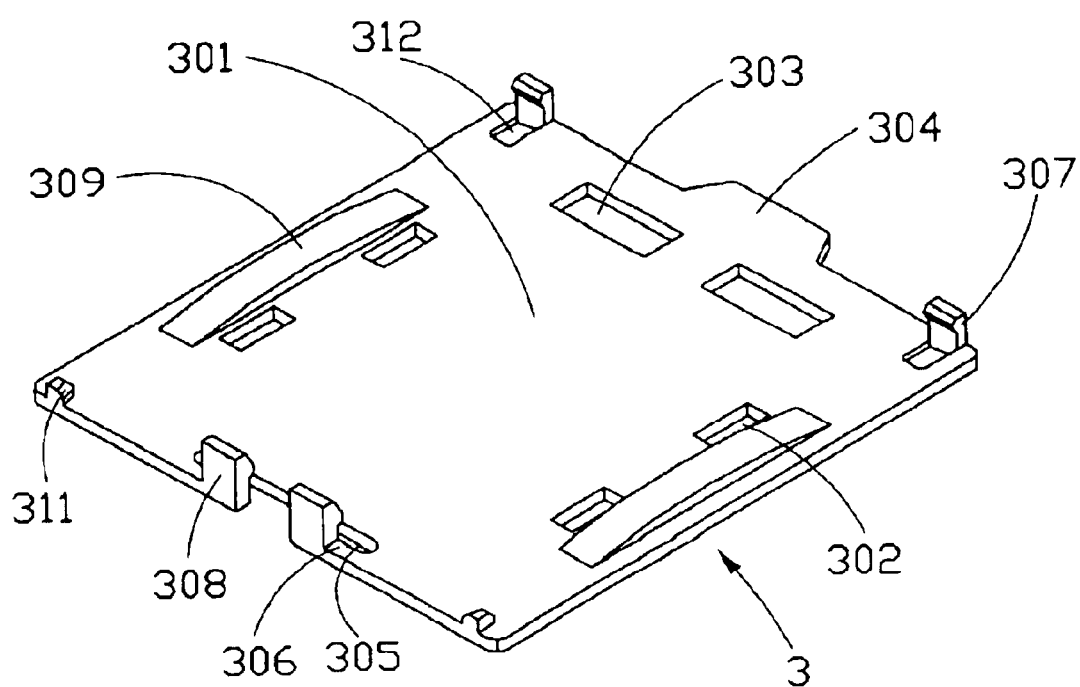
FIG. 2 is an isometric view of the pick up cap of FIG. 1, but showing the pick up cap inverted.

FIG. 2 is a view of the pick up cap 3 inverted. A pair of first clasps 307 is formed at opposite sides of the front end of the planar body 30 respectively. The first clasps 307 depend from the bottom surface 301 of the planar body 30. A recess 312 is defined in a portion of the planar body 30 adjacent a rear of each first clasp 307, thereby increasing a resilience of the clasp 307. A pair of second clasps 308 is formed at the rear end of the planar body 30. The second clasps 308 depend from free ends of the arms 306 respectively. A pair of protrusions 311 is formed at opposite sides of the rear end of the planar body 30 respectively. The protrusions 311 depend from the bottom surface 301. A pair of parallel arcuate ribs 309 is formed at the opposite lateral sides of the planar body 30 respectively. The ribs 309 depend from the bottom surface 301. The rib 309 defines a downward convex configuration to be compliantly received within the upward concave space (not labeled) which is formed above the downwardly curved configuration of the clip 25.

Figure 3:
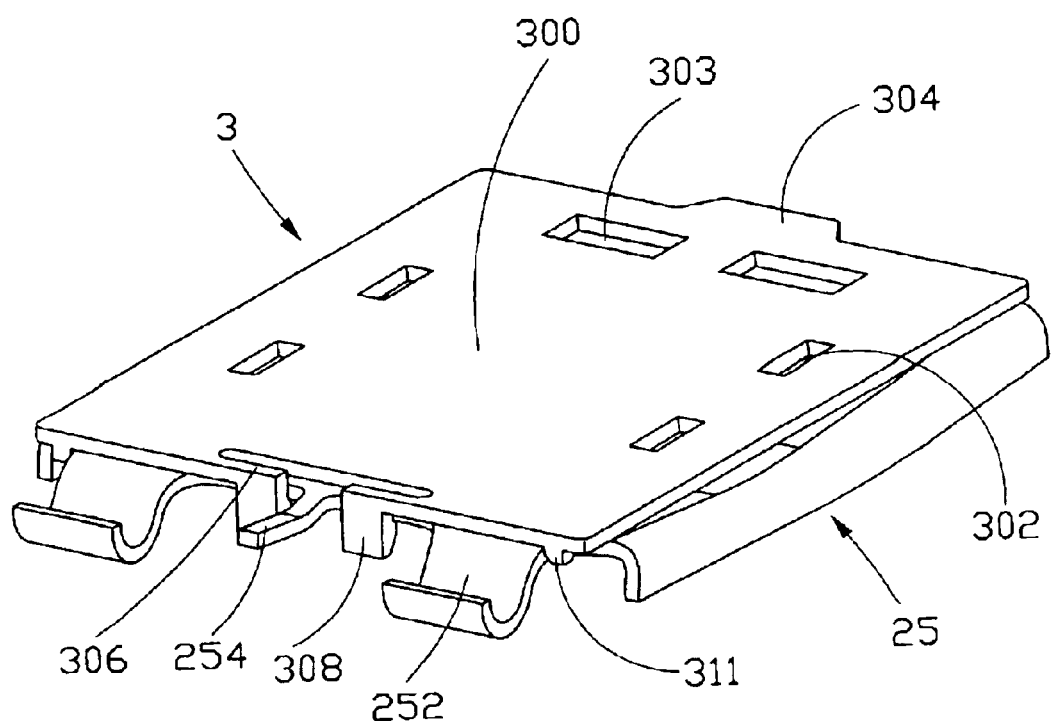
FIG. 3 is an assembled view of the pick up cap and a clip of the connector of FIG. 1, but viewed from another aspect.

Also referring to FIGS. 3 and 4, in attaching the pick up cap 3 onto the connector 2, the pick up cap 3 is disposed over the connector 2, with the first and second clasps 307, 308 loosely contacting corresponding edges of the clip 25 respectively. The pick up cap 3 is pressed down. The first clasps 307 and second clasps 308 are elastically deflected outwardly. When the ribs 309 of the pick up cap 3 contact the clip 25 and the channel 305 receives the tail 254 of the clip 25, the first and second clasps 307, 308 snappingly clasp the edges of the clip 25, and the protrusions 311 abut against the corresponding edge of the clip 25. The pick up cap 3 is thereby securely mounted onto the connector 2. In this position, a vacuum suction device (not shown) can engage the top surface 300 of the pick up cap 3 in order to move the connector assembly 1 to a desired location on the PCB.

During welding of the connector assembly 1 on the PCB, the holes 302, 303 facilitate dissipation of generated heat. Once the connector 2 has cooled down, the lip 304 of the pick up cap 3 is pulled upwardly, and the pick up cap 3 is detached from the clip 25 of the connector 2.

As will be appreciated from the foregoing description, during attachment of the pick up cap 3 onto the clip 25 of the connector 2 and detachment of the pick up cap 3 from the clip 25, the first and second clasps 307, 308 do not contact the first contact portions 220 of the contacts 22. Use of the pick up cap 3 does not damage the connector 2.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. A land grid array (LGA) connector assembly, comprising:
   an insulative housing defining a substantially rectangular cavity in a middle thereof, the cavity being adapted for receiving an electronic package therein;
   a plurality of electrical contacts received in a portion of the housing under the cavity;
   a metal clip disposed on the housing to press the electronic package upon the contacts; and
   a pick up cap attached to the clip, the pick up cap having a flat top surface to be engaged by a vacuum suction device.

2. The LGA connector assembly as claimed in claim 1, further comprising a metal frame in which the housing is received.

3. The LGA connector assembly as claimed in claim 2, further comprising a lever pivotably received in an end of the frame.

4. The LGA connector assembly as claimed in claim 3, wherein the clip is pivotably mounted to an opposite end of the frame for engaging with the lever.

5. The LGA connector assembly as claimed in claim 1, wherein said pick up cap has a clasp clasping a corresponding edge of the clip.

6. An electrical connector assembly comprising:
   an insulative housing subassembly defining a cavity for receiving an electronic package therein;
   a plurality of contacts located mainly under the cavity for mechanically and electrically connecting the electronic package;
   a metal clip moveable relative to the housing subassembly for allowing
   installation of the electronic package in the cavity when said clip is in an open position or sealing of the electronic package in the cavity when said clip is in a closed position, wherein said clip does riot provide a sufficiently large flat top surface thereon; and
   a pick-up cap attached to at least one of said clip and said housing subassembly and substantially located on said clip, wherein said pick-up cap provides a sufficiently large flat top surface thereon for suction by a vacuum suction device.

7. The assembly as claimed in claim 6, wherein said cap is attached to the clip.

8. The assembly as claimed in claim 6, wherein said clip defines a downwardly curved configuration for downwardly pressing said electronic package located in the cavity.

9. The assembly as claimed in claim 8, wherein said cap defines a convex configuration on the underside to be compliantly received within a concave space formed above the downwardly curved configuration of the clip.

10. The assembly as claimed in claim 6, wherein said clip is mounted to a frame of said housing subassembly, said frame surrounding said housing.

11. An electrical connector assembly comprising:

an insulative housing subassembly defining a cavity for receiving an electronic package therein;

a plurality of contacts located mainly under the cavity for mechanically and electrically connecting the electronic package;

a clip pivotally located on a top portion of the housing subassembly for allowing installation of the electronic package in the cavity when said clip is in an open position or sealing of the electron package in the cavity when said clip is in a closed position; and a pick-up cap for suction by a vacuum suction device, being disposed above the clip with provision of a sufficiently large planar top surface thereon, and fastened to at least one of said clip and said housing subassembly.

12. The assembly as claimed in claim 11, wherein said cap defines a convex configuration on the underside to be compliantly received within an upward concave space formed in the clip.

13. The assembly as claimed in claim 11, wherein said cap is attached to the clip.

* * * * *